(12) United States Patent
Funkenbusch et al.

(10) Patent No.: US 6,818,291 B2
(45) Date of Patent: Nov. 16, 2004

(54) DURABLE TRANSPARENT EMI SHIELDING FILM

(75) Inventors: Arnold William Funkenbusch, Mahtomedi, MN (US); Clark Ivan Bright, Tucson, AZ (US); Robert James Fleming, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/222,465

(22) Filed: Aug. 17, 2002

(65) Prior Publication Data

US 2004/0033384 A1 Feb. 19, 2004

(51) Int. Cl.$^7$ .......................... B32B 15/04; B32B 15/08; H05K 5/00; H05K 9/00
(52) U.S. Cl. ...................... 428/336; 428/626; 428/457; 428/673; 428/460; 174/51; 361/818
(58) Field of Search ................................ 428/626, 673, 428/686, 457, 460, 929, 336; 174/6, 51; 361/818; 257/508, 659

(56) References Cited

U.S. PATENT DOCUMENTS

| | | | |
|---|---|---|---|
| 3,302,002 A | 1/1967 | Warren | 219/543 |
| 3,311,517 A | 3/1967 | Keslar et al. | 156/104 |
| 3,529,074 A | 9/1970 | Lewis | 174/68.5 |

(List continued on next page.)

FOREIGN PATENT DOCUMENTS

| | | |
|---|---|---|
| EP | 0 810 452 A2 | 12/1997 |
| EP | 0873839 A1 | 10/1998 |
| EP | 0944299 A2 A3 | 9/1999 |
| EP | 0977167 A1 | 2/2000 |
| WO | WO 95/10117 | 4/1995 |
| WO | WO 97/01440 | 1/1997 |
| WO | WO 97/01778 | 1/1997 |
| WO | WO 97/04885 | 2/1997 |
| WO | WO 98/26927 | 6/1998 |
| WO | WO 99/36248 | 7/1999 |
| WO | WO 99/36262 | 7/1999 |
| WO | WO 00/26973 | 5/2000 |
| WO | WO 00/48749 | 8/2000 |
| WO | WO 01/31393 A1 | 5/2001 |
| WO | WO 01/58989 A1 | 8/2001 |
| WO | WO 01/96104 A2 | 12/2001 |
| WO | WO 01/96115 A1 | 12/2001 |

OTHER PUBLICATIONS

H.G. Elias, "An Introduction to Plastics," VCH Verlagsgesellaschaft mbH (Weinheim, Germany), 1993, no month, p. 249.*
U.S. patent application Ser. No. 10/222,466, Polymer–Metal Infrared Interference Filter, filed Aug. 17, 2002.
U.S. patent application Ser. No. 10/222,473, Enhanced Heat Mirror Films, filed Aug. 17, 2002.
U.S. patent application Ser. No. 10/222,449, Flexible Electrically Conductive Film, filed Aug. 17, 2002.
Presentation: Affinito et al., "Polymer–Oxide Transparent Barrier Layers," SVC 39$^{th}$ Annual Technical Conference, Paper No. W–12, (1996), pp. 1–6, no month.
Presentation: Shaw et al., "A New Vapor Deposition Process for Coating Paper and Polymer Webs," Sixth International Vacuum Web Coating Conference, Reno, NV, Oct. 28, 1992, pp. 18–24.

(List continued on next page.)

*Primary Examiner*—Michael La Villa
(74) *Attorney, Agent, or Firm*—Melanie G. Gover; Pamela L. Stewart

(57) ABSTRACT

A device or an enclosed area that can cause or is sensitive to electromagnetic interference (EMI) is shielded by at least partially surrounding the device or the area with a visible light-transmissive film comprising a flexible support, an extensible visible light-transmissive metal or metal alloy layer and a visible light-transmissive crosslinked polymeric protective layer, and connecting at least one grounding electrode to the metal or metal alloy layer. The film has reduced susceptibility to fracture or corrosion compared to commercially available EMI shielding films.

27 Claims, 6 Drawing Sheets

U.S. PATENT DOCUMENTS

| | | | |
|---|---|---|---|
| 3,601,471 A | 8/1971 | Seddon et al. | 350/166 |
| 3,682,528 A | 8/1972 | Apfel et al. | |
| 3,752,348 A | 8/1973 | Dickason et al | 219/203 |
| 3,897,140 A | 7/1975 | Tuthill | 350/314 |
| 3,990,784 A | 11/1976 | Gelber | 350/166 |
| 4,017,661 A | 4/1977 | Gillery | 428/412 |
| 4,166,876 A | 9/1979 | Chiba et al. | 428/215 |
| 4,226,910 A | 10/1980 | Dahlen et al. | 428/336 |
| 4,234,654 A | 11/1980 | Yatabe et al. | 428/333 |
| 4,320,169 A | 3/1982 | Yatabe et al. | 428/333 |
| 4,413,877 A | 11/1983 | Suzuki et al. | 350/1.7 |
| 4,590,118 A | 5/1986 | Yatabe et al. | 428/215 |
| 4,639,069 A | 1/1987 | Yatabe et al. | 350/1.7 |
| 4,645,714 A | 2/1987 | Roche et al. | 428/458 |
| 4,696,719 A | 9/1987 | Bischoff | 202/205 |
| 4,722,515 A | 2/1988 | Ham | 261/142 |
| 4,782,216 A | 11/1988 | Woodard | 219/547 |
| 4,786,783 A | 11/1988 | Woodard | 219/547 |
| 4,799,745 A | 1/1989 | Meyer et al. | 350/1.7 |
| 4,842,893 A | 6/1989 | Yializis | 427/44 |
| 4,910,090 A | 3/1990 | Kuhlman et al. | 428/469 |
| 4,954,371 A | 9/1990 | Yializis | 427/44 |
| 4,965,408 A | 10/1990 | Chapman et al. | 174/35 MS |
| 4,973,511 A | 11/1990 | Farmer et al. | 428/216 |
| 5,011,585 A | 4/1991 | Brochot et al. | 204/192.13 |
| 5,018,048 A | 5/1991 | Shaw et al. | 361/323 |
| 5,032,461 A | 7/1991 | Shaw et al. | 428/461 |
| 5,071,206 A | 12/1991 | Hood et al. | 359/360 |
| 5,085,141 A | 2/1992 | Triffaux | 100/155 G |
| 5,097,800 A | 3/1992 | Shaw et al. | 118/730 |
| 5,125,138 A | 6/1992 | Shaw et al. | 29/25.42 |
| 5,260,095 A | 11/1993 | Affinito | 427/124 |
| 5,324,374 A | 6/1994 | Harmand et al. | 156/102 |
| 5,332,888 A | 7/1994 | Tausch et al. | 219/547 |
| 5,360,659 A | 11/1994 | Arends et al. | 428/216 |
| 5,395,644 A | 3/1995 | Affinito | 427/124 |
| 5,440,446 A | 8/1995 | Shaw et al. | 361/301.5 |
| 5,489,489 A | 2/1996 | Swirbel et al. | 428/615 |
| 5,547,508 A | 8/1996 | Affinito | 118/50 |
| 5,681,615 A | 10/1997 | Affinito et al. | 427/255.6 |
| 5,681,666 A | 10/1997 | Treger et al. | 428/90 |
| 5,686,360 A | 11/1997 | Harvey, III et al. | 437/211 |
| 5,699,188 A | 12/1997 | Gilbert et al. | 359/584 |
| 5,725,909 A | 3/1998 | Shaw et al. | 427/412.1 |
| 5,744,227 A | 4/1998 | Bright et al. | 428/216 |
| 5,757,126 A | 5/1998 | Harvey, III et al. | 313/506 |
| 5,771,562 A | 6/1998 | Harvey, III et al. | 29/592.1 |
| 5,773,102 A | 6/1998 | Rehfeld | 428/134 |
| 5,783,049 A | 7/1998 | Bright et al. | 204/192.14 |
| 5,877,895 A | 3/1999 | Shaw et al. | 359/588 |
| 5,981,059 A | 11/1999 | Bright et al. | 428/336 |
| 6,007,901 A | 12/1999 | Maschwitz et al. | 428/216 |
| 6,030,671 A | 2/2000 | Yang et al. | 428/34 |
| 6,045,864 A | 4/2000 | Lyons et al. | 427/255.23 |
| 6,049,419 A | 4/2000 | Wheatley et al. | 359/359 |
| 6,083,628 A | 7/2000 | Yializis | 428/463 |
| 6,111,698 A | 8/2000 | Woodard et al. | 359/585 |
| 6,146,225 A | 11/2000 | Sheats et al. | 445/24 |
| 6,214,422 B1 | 4/2001 | Yializis | 427/488 |
| 6,231,939 B1 | 5/2001 | Shaw et al. | 428/35.9 |
| 6,243,201 B1 | 6/2001 | Fleming et al. | 359/530 |
| 6,255,003 B1 | 7/2001 | Woodard et al. | 428/623 |
| 6,268,695 B1 | 7/2001 | Affinito | 313/504 |
| 6,480,250 B1 * | 11/2002 | Matsufuji et al. | 349/113 |
| 6,483,719 B1 * | 11/2002 | Bachman | 361/816 |
| 6,596,937 B2 * | 7/2003 | Mazurkiewicz | 174/35 R |
| 6,621,003 B2 * | 9/2003 | Yoshida et al. | 174/35 MS |
| 2002/0042162 A1 * | 4/2002 | Tone et al. | 438/118 |
| 2002/0180324 A1 * | 12/2002 | Yoshida et al. | 313/112 |
| 2003/0085649 A1 * | 5/2003 | Wachi et al. | 313/479 |

OTHER PUBLICATIONS

Presentation: Shaw et al., "A New High Speed Process for Vapor Depositing Acrylate Thin Films: An Update," Society of Vacuum Coaters 36$^{th}$ Annual Technical Conference (1993), pp. 348–352, no month.

Presentation: Shaw et al., "Use of Vapor Deposited Acrylate Coatings to Improve the Barrier Properties of Metallized Film," Society of Vacuum Coaters 37$^{th}$ Annual Technical Conference (1994), pp. 240–247, no month.

Presentation: Shaw et al., "Use of Evaporated Acrylate Coatings to Smooth the Surface of Polyester and Polypropylene Film Substrates," Rad Tech (1996), (12 pages), no month.

Article: Affinito et al., "Vacuum Deposited Polymer/Metal Multilayer Films for Optical Application," *Thin Solid Films,* vol. 270, (1995), pp. 43–48, no month.

Product Information: "Southwall™ Altair™ M Transparent Conductive Film," (date unknown but is prior to filing date of instant application), 1 page, no date.

Product Information: "Shielded Windows," Advanced Performance Materials, (date unknown but is prior to filing date of instant application), 1 page, no date.

Product Information: "EMI Shielding Products," Advanced Performance Materials, (date unknown but is prior to filing date of instant application), 2 pages, no date.

Technological Information: "EMI Theory," Chomerics, (date unknown but is prior to filing date of instant application), pp. 1–3, no date.

Technological Information: "Shielding Methods," Chomerics, (date unknown but is prior to filing date of instant application), pp. 1–7.

Product Information: "Display Products," Southwall Technologies, (date unknown but is prior to filing date of instant application), pp. 1–2, no date.

Product Information: "BE 9 Shielded Windows," Advanced Performance Materials GMBH, (date unknown but is prior to filing date of instant application), pp. 60–67, no date.

Book Excerpt: Austin, "Chapter 8: Electromagnetic Compatibility for Electrical Engineering," *Electrical Engineer's Reference Book,* Butterworth–Heinemann, Oxford, UK, Fifteenth Edition, (1993), pp. 8/3–8/14, no month.

Book: White and Mardiguian, "vol. 3: Electromagnetic Shielding," *A Handbook Series on Electromagnetic Interference and Compatibility,* Interference Control Technologies, Inc., Gainesville, Virginia, (1988), title page and table of contents, 12 pages, no month.

Book: Gnecco, *The Design of Shielded Enclosures: Cost–Effective Methods to Prevent EMI,* Butterworth–Heinemann, Boston, MA, (2000), title page, table of contents, List of Illustrations, and List of Tables, 13 pages, no month.

Book: White and Mardiguian, "vol. 8: EMI Control Methodology and Procedures," *A Handbook Series on Electromagnetic Interference and Compatibility,* Interference Control Technologies, Inc., Gainesville, Virginia, (1989), title page and table of contents, 11 pages, no month.

Article: Cairns et al., "Strain–Dependent Electrical Resistance of Tin–Doped Indium Oxide on Polymer Substrates," *Applied Physics Letters,* vol. 76, No. 11, Mar. 13, 2000, pp. 425–427.

* cited by examiner

DURABLE TRANSPARENT EMI SHIELDING FILM

FIELD OF THE INVENTION

This invention relates to electromagnetic interference (EMI) shielding.

BACKGROUND

EMI shielding films block the transmission of unwanted electromagnetic energy into or out of electronic equipment. A variety of conductive materials can be used for this purpose. For applications in which it is necessary to see through the shielding (e.g., to view a display), windows containing fine wire mesh and specialized transparent films have been used. Transparent EMI shields are also described in U.S. Pat. Nos. 4,910,090 and 5,489,489 and in European Patent Application No. EP 810452. Commercially available transparent EMI shielding films typically employ a polymer substrate such as PET coated with a conductive oxide film (e.g., indium tin oxide) or with alternating coated layers of metal (e.g., silver) and conductive oxide. Representative commercially available transparent EMI shielding films include AgHT4 and AgHT8 films (CP Films, Inc.), ALTAIR™ M transparent conductive film (Southwall Technologies) and AgF8 film (Chomerics Division of Parker Hannifin Corporation).

Current commercially available EMI shielding films lack adequate durability and contamination and corrosion resistance. For example, the handling guidelines for film-based shields supplied by CP Films, Inc. recommend that workers wear non-dusted latex gloves and face masks when handling shielding films; caution that the conductive film coating is susceptible to attack by inorganic ions such as sodium, potassium and chloride, all of which are present on human fingers and in saliva; and recommend that if the film does become contaminated, its surface should be cleaned with a non-linting clean room wipe dampened in isopropyl alcohol. These handling guidelines also caution against excess rubbing when wiping the coating, since it is very thin and somewhat fragile.

SUMMARY OF THE INVENTION

The present invention provides, in one aspect, a process for transparently shielding a device or enclosed area that can cause or is sensitive to electromagnetic interference, comprising at least partially surrounding the device or area with a visible light-transmissive film comprising a flexible support, an extensible visible light-transmissive continuous metal or metal alloy layer and a visible light-transmissive crosslinked polymeric protective layer, and connecting at least one grounding electrode to the metal or metal alloy layer.

In a second aspect, the invention provides an electromagnetically shielded article comprising a device or enclosed area that can cause or is sensitive to electromagnetic interference, wherein the device or area is at least partially surrounded with a visible light-transmissive film comprising a flexible support, an extensible visible light-transmissive continuous metal or metal alloy layer and a visible light-transmissive crosslinked polymeric protective layer, and at least one grounding electrode connected to the metal or metal alloy layer.

In a third aspect, the invention provides an electromagnetically shielded article comprising a device or an enclosed area that can cause or is sensitive to electromagnetic interference, wherein the device or area is at least partially surrounded with a visible light-transmissive film comprising a flexible support, and first and second extensible visible light-transmissive continuous metal or metal alloy layers separated by a visible light-transmissive crosslinked polymeric protective layer.

EMI shields made according to the invention can have increased resistance to delamination, fracture or corrosion when subjected to bending, flexing, stretching or corrosive conditions, yet still maintain good EMI shielding performance.

BRIEF DESCRIPTION OF THE DRAWING

Like reference symbols in the various figures of the drawing indicate like elements. The elements in the drawing are not to scale.

DETAILED DESCRIPTION

By using words of orientation such as "atop", "on", "uppermost" and the like for the location of various layers in the films or articles of the invention, we refer to the relative position of one or more layers with respect to a horizontal support layer. We do not intend that the films or articles should have any particular orientation in space during or after their manufacture.

By a "crosslinked" polymer, we mean a polymer in which polymer chains are joined together by covalent chemical bonds, usually via crosslinking molecules or groups, to form a network polymer. A crosslinked polymer is generally characterized by insolubility, but may be swellable in the presence of an appropriate solvent. The term "polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

By a "visible light-transmissive" support, layer, film or article, we mean that the support, layer, film or article has a transmission in the visible portion of the spectrum, $T_{vis}$, of at least about 20%, measured along the normal axis. By an "infrared-reflective" support, layer, film or article, we mean that the support, layer, film or article reflects at least about 50% of light in a band at least 100 nm wide in a wavelength region from about 700 nm to about 2000 nm, measured at a near-normal angle (e.g., at about a 6° angle of incidence). By "light" we mean solar radiation.

By a "non-planar" surface or article (e.g., of glass or other glazing material), we mean that surface or article has a continuous, intermittent, unidirectional or compound curvature. By a surface or article with "compound curvature", we mean that the surface or article curves in two different, non-linear directions from a single point.

By an "extensible" metal or metal alloy layer we refer to a layer that when incorporated into the visible light-transmissive film can be stretched by at least 3% in an in-plane direction without loss of electrical continuity and without forming visible discontinuities in the surface of the metal or metal alloy layer as detected by the naked eye at a distance of about 0.25 meters.

By "optically clear" we refer to an article in which there is an absence of visibly noticeable distortion, haze or flaws as detected by the naked eye at a distance of about 1 meter, preferably about 0.5 meters.

Figure 1:
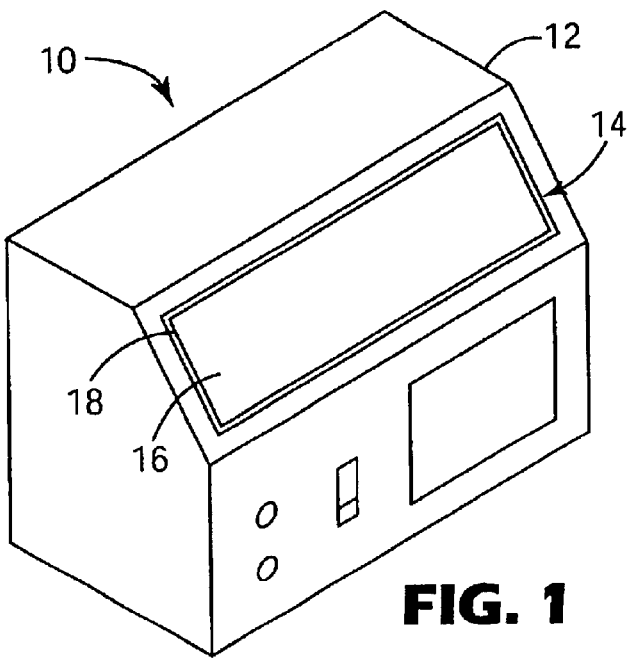
FIG. 1 is a schematic perspective view of an electromagnetically shielded article of the invention.

Referring to FIG. 1, medical device 10 is partially shielded from EMI by metal housing 12. Information display 14 on housing 12 is covered with a transparent EMI shielding film 16 of the invention. Metallic bezel 18 surrounds film 16 and serves as a grounding electrode that electrically connects the entire perimeter of film 6 to housing 12. Film 16 provides EMI shielding for the remainder of device 10 not already shielded by housing 12.

Figure 2:
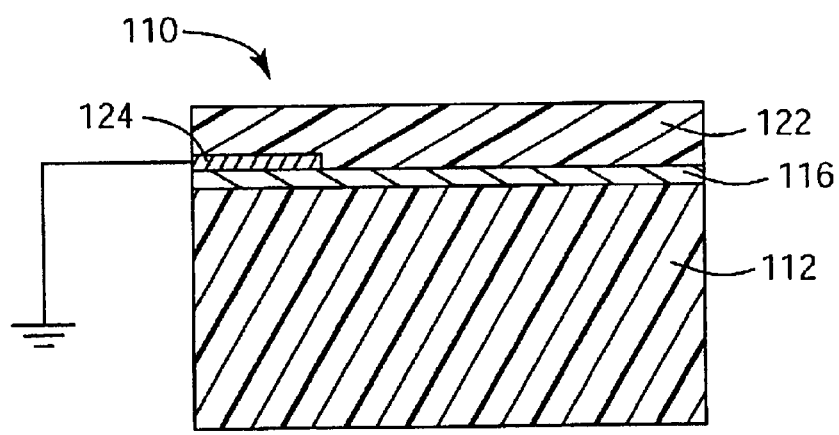
FIG. 2 is a schematic cross-sectional view of a film for use in the invention.

Referring to FIG. 2, a film for use in the invention is shown generally at 110. Film 110 includes flexible support 112 made of a visible light-transparent plastic film such as polyethylene terephthalate ("PET"). Extensible visible light-transparent metal layer 116 made of silver lies atop support 112. Protective layer 122 made of a crosslinked acrylate polymer lies atop metal layer 116. Metal layer 116 is grounded via electrode 124.

Figure 3:
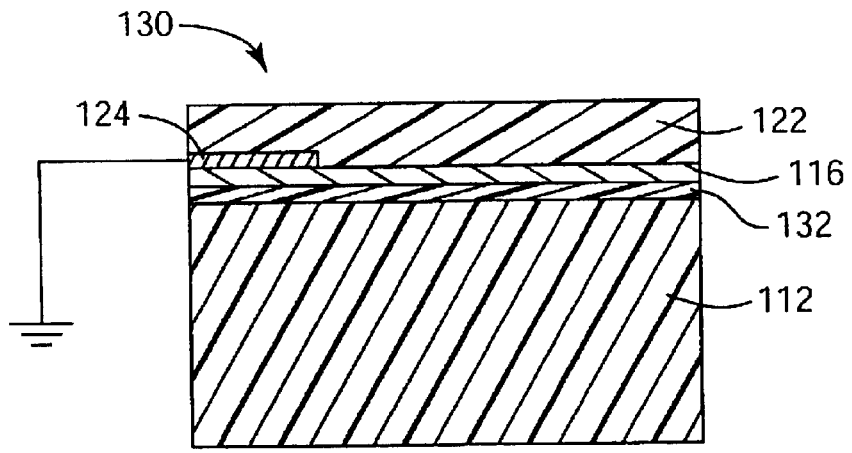
FIG. 3 is a schematic cross-sectional view of another film for use in the invention.

In FIG. 3, another film for use in the invention is shown generally at 130. Film 130 resembles film 110, but includes a base coat layer 132 made from crosslinked acrylate polymer between support 112 and metal layer 116.

Figure 4:
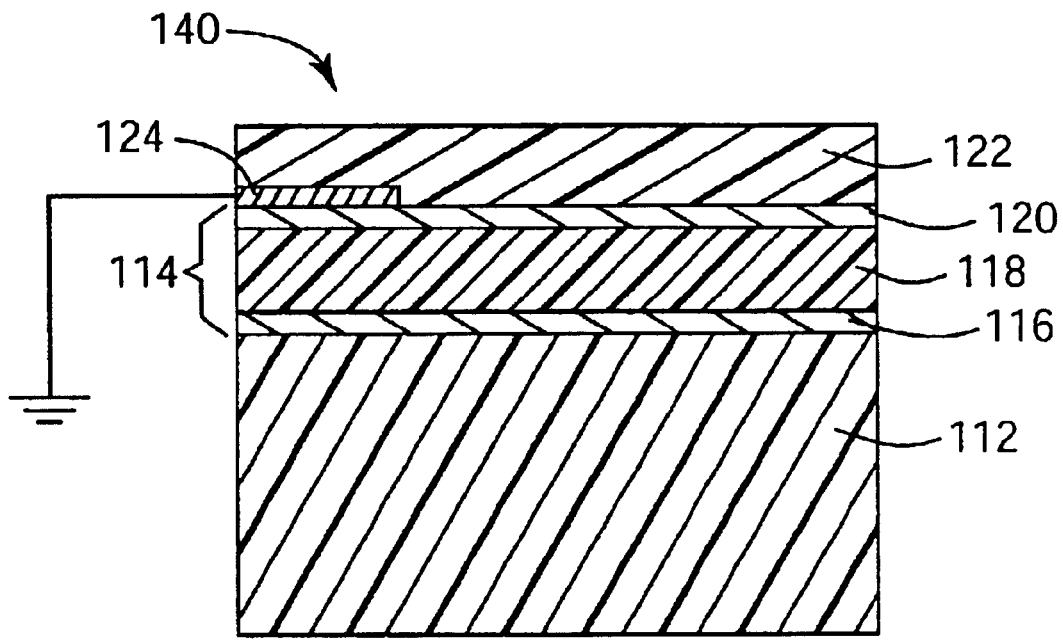
FIG. 4 is a schematic cross-sectional view of another film for use in the invention.

In FIG. 4, a film for use in the invention is shown generally at 140. Film 140 resembles film 110, but includes Fabry-Perot quarter wave interference stack 114 atop support 112. Stack 114 includes first visible light-transparent metal layer 116, a visible light-transparent spacing layer 118 made of a crosslinked acrylate polymer, and second visible light-transparent metal layer 120 made of silver. The thicknesses of the metal layers 116 and 120 and the intervening crosslinked polymeric layer 118 are carefully chosen so that metal layers 116 and 120 are partially reflective and partially transmissive. Spacing layer 118 has an optical thickness (defined as the physical thickness of layer times its in-plane index of refraction) that is about ¼ the wavelength of the center of the desired pass band for transmitted light. Light whose wavelength is within the pass band is mainly transmitted through the thin metal layers 116 and 120. Light whose wavelength is above the pass band is mainly reflected by the thin metal layers 116 and 120 or canceled due to destructive interference.

Figure 5:
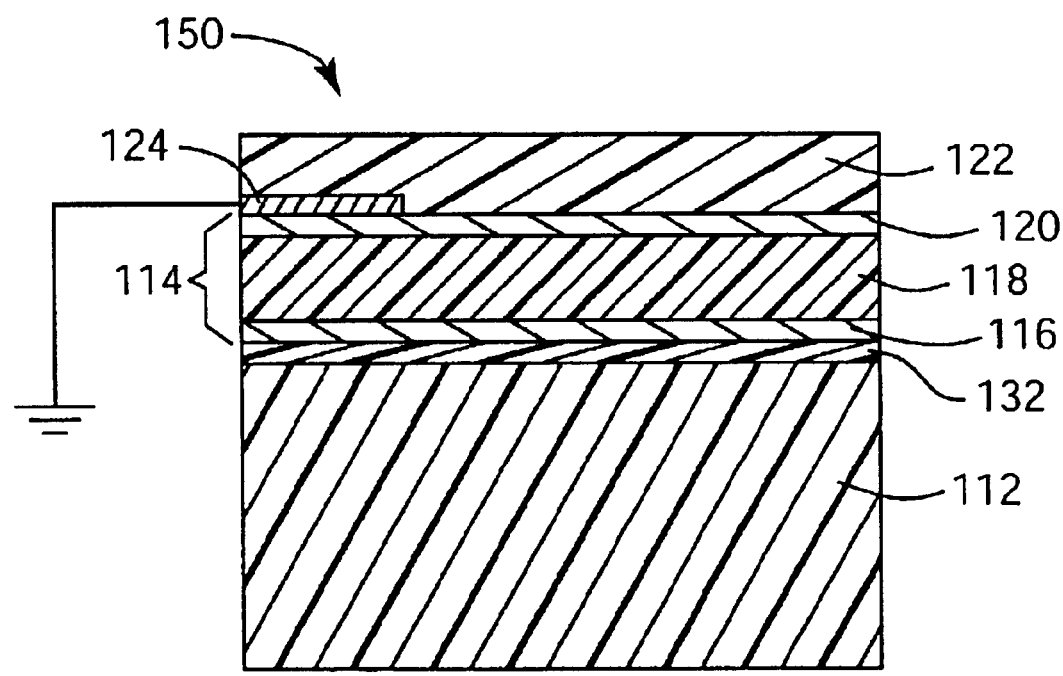
FIG. 5 is a schematic cross-sectional view of another film for use in the invention.

In FIG. 5, another film for use in the invention is shown generally at 150. Film 150 resembles film 140, but includes base coat layer 132 between support 112 and metal layer 116.

A variety of visible light-transparent flexible supports can be employed. Preferred supports have a visible light transmission of at least about 70% at 550 am. Particularly preferred supports are flexible plastic materials including thermoplastic films such as polyesters (e.g., PET), polyacrylates (e.g., polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide; and thermoset films such as cellulose derivatives, polyimide, polyimide benzoxazole and poly benzoxazole. The support can also be a multilayer optical film ("MOF") coated with at least one crosslinked polymeric layer and metal or metal alloy layer, such as those described in copending application Ser. No. 10/222,473, filed Aug. 17, 2002 and entitled "ENHANCED HEAT MIRROR FILMS", incorporated herein by reference. Supports made of PET and MOF are especially preferred. Preferably the support has a thickness of about 0.01 to about 1 mm.

The metal layer 116 can be made from a variety of materials. Preferred metals include elemental silver, gold, copper, nickel, chrome, with silver being especially preferred. Alloys, such as stainless steel, or dispersions containing these metals in admixture with one another or with other metals also can be employed. When additional metal layers are employed, they can be the same as or different from one another, and need not have the same thickness. Preferably the metal layer or layers are sufficiently thick so as to be continuous, and sufficiently thin so as to ensure that the film and articles employing the film will have the desired degree of EMI shielding and visible light transmission. Preferably the physical thickness (as opposed to the optical thickness) of the metal layer or layers is about 3 to about 50 nm, more preferably about 4 to about 15 nm. Typically the metal layer or layers are formed by deposition on the above-mentioned support using techniques employed in the film metallizing art such as sputtering (e.g., cathode or planar magnetron sputtering), evaporation (e.g., resistive or electron beam evaporation), chemical vapor deposition, plating and the like.

The smoothness and continuity of the first metal layer and its adhesion to the support preferably are enhanced by appropriate pretreatment of the support. A preferred pretreatment regimen involves electrical discharge pretreatment of the support in the presence of a reactive or non-reactive atmosphere (e.g., plasma, glow discharge, corona discharge, dielectric barrier discharge or atmospheric pressure discharge); chemical pretreatment; flame pretreatment; or application of a nucleating layer such as the oxides and alloys described in U.S. Pat. Nos. 3,601,471 and 3,682,528. These pretreatments help ensure that the surface of the support will be receptive to the subsequently applied metal layer. Plasma pretreatment is particularly preferred. A further particularly preferred pretreatment regimen involves coating the support with an inorganic or organic base coat layer such as layer 132 above, optionally followed by further pretreatment using plasma or one of the other pretreatments described above. Organic base coat layers, and especially base coat layers based on crosslinked acrylate polymers, are especially preferred. Most preferably, the base coat layer is formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. Nos. 4,696,719, 4,722,515, 4,842,893, 4,954,371, 5,018,048, 5,032,461, 5,097,800, 5,125,138, 5,440,446, 5,547,508, 6,045,864, 6,231,939 and 6,214,422; in published PCT Application No. WO 00/26973; in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affmito, P. Martin, M. Gross, C. Coronado and E. Greenwell, "Vacuum deposited polymer/metal multilayer films for optical application", Thin Solid Films 270, 43 –48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). If desired, the base coat can also be applied using conventional coating methods such as roll coating (e.g., gravure roll coating) or spray coating (e.g., electrostatic spray coating), then crosslinked using, for example, UV radiation. The desired chemical composition and thickness of the base coat layer will depend in part on the nature of the support. For example, for a PET support, the base coat layer preferably is formed from an acrylate monomer and typically will have a thickness of only a few nm up to about 2 micrometers.

The adhesion of the first metal layer to a base coat layer can be further improved by including an adhesion-promoting or anticorrosion additive in the base coat layer. This can affect the surface energy or other relevant characteristics of the interface between the base coat layer and the first metal layer. Suitable adhesion-promoting or anticorrosion additives include mercaptans, thiol-containing compounds, acids (such as carboxylic acids or organic phosphoric acids), triazoles, dyes and wetting agents. Ethylene glycol bis-thioglycolate (described in U.S. Pat. No. 4,645,714) is a particularly preferred additive. The additive preferably is present in amounts sufficient to obtain the desired degree of increased adhesion, without causing undue oxidation or other degradation of the first metal layer.

A crosslinked polymeric layer lies atop the first metal layer, and serves as a protective corrosion-resistant topcoat 122 if no other metal layers are present and as a spacing layer such as layer 118 if additional metal layers are employed. Stacks containing 2,3 or 4 metal layers provide desirable characteristics for some applications. Stacks containing 2 to 4 metal layers in which each of the metal layers has a crosslinked polymeric layer adjacent to each of its faces are especially preferred. Exemplary films containing Fabry-Perot optical interference stacks are described in copending application Ser. No. 10/222,466, filed Aug. 17, 2002 and entitled "POLYMER-METAL INFRARED INTERFERENCE FILTER", incorporated herein by reference, and in the above mentioned copending application Ser. No. 10/222,473. Use of a crosslinked polymeric spacing layer between metal or metal alloy layers renders the film and its metal layers more readily extensible without damage to the metal layers or alteration in their conductivity or spacing.

The crosslinked polymeric layer can be formed from a variety of organic materials. Preferably the polymeric layer is crosslinked in situ atop the first metal or alloy layer. If desired, the polymeric layer can be applied using conventional coating methods such as roll coating (e.g., gravure roll coating) or spray coating (e.g., electrostatic spray coating), then crosslinked using, for example, UV radiation. Most preferably the polymeric layer is formed by flash evaporation, vapor deposition and crosslinking of a monomer as described above for base coat layer 132. Volatilizable (meth)acrylate monomers are preferred for use in such a process, with volatilizable acrylate monomers being especially preferred. Preferred (meth)acrylates have a molecular weight in the range of about 150 to about 600, more preferably about 200 to about 400. Other preferred (meth) acrylates have a value of the ratio of the molecular weight to the number of acrylate functional groups per molecule in the range of about 150 to about 600 g/mole/(meth)acrylate group, more preferably about 200 to about 400 g/mole/ (meth)acrylate group. Fluorinated (meth)acrylates can be used at higher molecular weight ranges or ratios, e.g., about 400 to about 3000 molecular weight or about 400 to about 3000 g/mole/(meth)acrylate group. Coating efficiency can be improved by cooling the support. Particularly preferred monomers include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2, 2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof. The physical thickness of the crosslinked polymeric layer will depend in part upon its refractive index and in part upon the desired optical characteristics of the film (e.g., on whether the film contains additional metal layers). For use in an infrared-rejecting EMI shielding film containing a Fabry-Perot stack, the crosslinked polymeric layer typically will have a refractive index of about 1.3 to about 1.7, and preferably will have an optical thickness of about 75 to about 200 nm, more preferably about 100 to about 150 nm and a corresponding physical thickness of about 50 to about 130 nm, more preferably about 65 to about 100 nm.

The smoothness and continuity of the crosslinked polymeric layer and its adhesion to the first metal layer preferably are enhanced by appropriate pretreatment of the first metal layer prior to application of the crosslinked polymeric layer, or by inclusion of a suitable additive in the crosslinked polymeric layer. Preferred pretreatments include the support pretreatments described above, with plasma pretreatment of the first metal layer being particularly preferred. Preferred additives for the crosslinked polymeric layer include the base coat layer additives described above.

The smoothness and continuity of any additionally applied metal layers and their adhesion to an underlying crosslinked polymeric layer preferably are enhanced by appropriate pretreatment of the crosslinked polymeric layer prior to application of the additionally applied metal layer, or by inclusion of a suitable additive in the crosslinked polymeric layer. Preferred pretreatments include the support pretreatments described above, with plasma pretreatment of the crosslinked polymeric layer being particularly preferred. Preferred additives for the crosslinked polymeric layer include the base coat layer additives described above.

Surprisingly, we have also discovered that when one or both of the above-described pretreatments is employed, and when one or more of the above-described base coat layer additives is incorporated into the monomer mixture used for forming the spacing layer(s), the resistance of the metal layer(s) to corrosion under the influence of an electrical current is markedly enhanced. Plasma treatment is a preferred pretreatment, with a nitrogen plasma being especially preferred. Ethylene glycol bis-thioglycolate is a preferred additive for incorporation into the monomer mixture.

Various functional layers or coatings can be added to the EMI shielding film to alter or improve its physical or chemical properties, particularly at the surface of the film. Such layers or coatings can include, for example, low friction coatings or slip particles to make the film easier to handle during film manufacturing; particles to add diffusion properties to the film or to prevent wet-out or Newton's rings when the film is placed next to another film or surface; antireflection layers to prevent glare when the EMI shielding film is applied to the face of an information display; antistatic coatings; abrasion resistant or hardcoat materials; anti-fogging materials; magnetic or magneto-optic coatings or films; adhesives such as pressure sensitive adhesives or hot melt adhesives; primers to promote adhesion to adjacent layers; low adhesion backsize materials for use when the film is to be used in adhesive roll form; liquid crystal panels; electrochromic or electroluminescent panels; photographic emulsions; prismatic films and holographic films or images. Additional functional layers or coatings are described, for example, in WO 97/01440, WO 99/36262, and WO 99/36248. The functional layers or coatings can also include shatter resistant, anti-intrusion, or puncture-tear resistant films and coatings, for example, the functional layers described in WO 01/96115. Additional functional layers or coatings can include vibration-damping film layers such as those described in WO 98/26927 and U.S. Pat. No. 5,773, 102, and barrier layers to provide protection or to alter the transmissive properties of the film towards liquids such as water or organic solvents or towards gases such as oxygen, water vapor or carbon dioxide. These functional components can be incorporated into one or more of the outermost layers of the EMI shielding film, or they can be applied as a separate film or coating.

For some applications, it may be desirable to alter the appearance or performance of the EMI shielding film, such as by laminating a dyed film layer to the film, applying a pigmented coating to the surface of the film, or including a dye or pigment in one or more of the materials used to make the film. The dye or pigment can absorb in one or more selected regions of the spectrum, including portions of the infrared, ultraviolet or visible spectrum. The dye or pigment can be used to complement the properties of the film, particularly where the film transmits some frequencies while reflecting others. A particularly useful pigmented layer that can be employed in the films or pre-laminates of the invention is described in WO 2001/58989. This layer can be laminated, extrusion coated or coextruded as a skin layer on the film. The pigment loading level can be varied between about 0.01 and about 1.0% by weight to vary the visible light transmission as desired. The addition of a UV absorptive cover layer can also be desirable in order to protect any inner layers of the film that may be unstable when exposed to UV radiation. The EMI shielding film can also be treated with, for example, inks or other printed indicia such as those used to display product identification, orientation information, advertisements, warnings, decoration, or other information. Various techniques can be used to print on the EMI shielding film, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

The EMI shielding films can be oriented and optionally heat set under conditions sufficient to assist the film in conforming without substantial wrinkling to a non-planar substrate. This is especially useful when a non-planar substrate to which an EMI shielding film is to be laminated has a known shape or curvature, and especially when the laminate has a known severe compound curvature. By individually controlling the shrinkage of the EMI shielding film or substrate in each in-plane direction, the EMI shielding film can be caused to shrink in a controlled fashion during lamination, especially during nip roll lamination. Further details regarding techniques for manufacturing MOF supports having targeted shrinkage properties are described in WO 01/96104, the disclosure of which is incorporated herein by reference.

Figure 6:
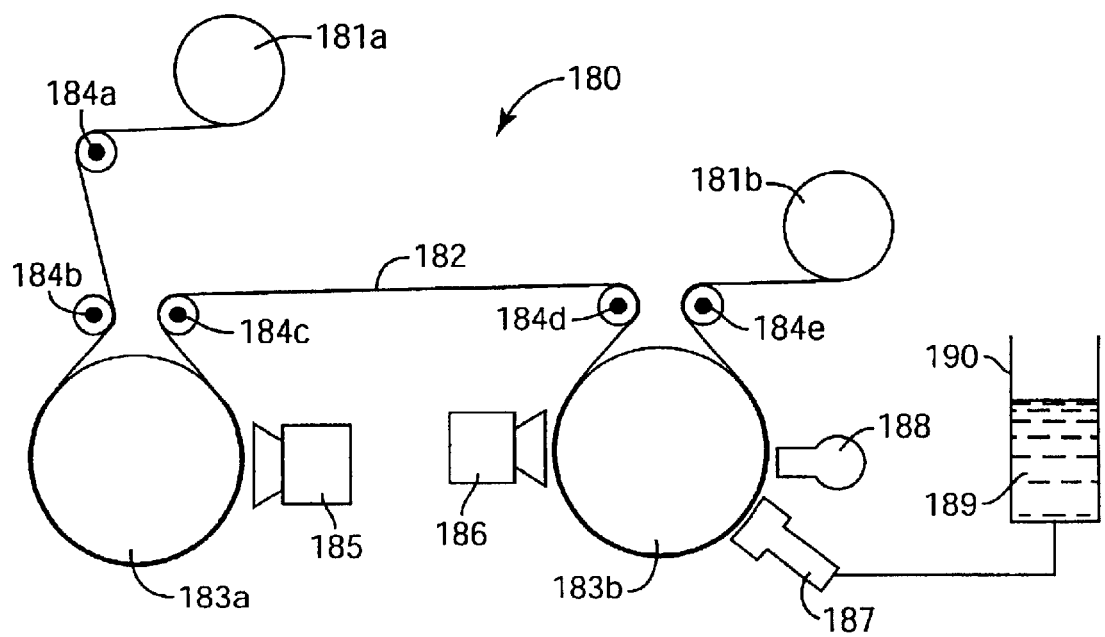
FIG. 6 is a schematic view of an apparatus for manufacturing films for use in the invention.

An apparatus 180 that can conveniently be used to manufacture films for use in the invention is shown in FIG. 6. Powered reels 181*a* and 181*b* move supporting web 182 back and forth through apparatus 180. Temperature-controlled rotating drums 183*a* and 183*b*, and idlers 184*a*, 184*b*, 184*c*, 184*d* and 184*e* carry web 182 past metal sputtering applicator 185, plasma pretreater 186, monomer evaporator 187 and E-beam crosslinking apparatus 188. Liquid monomer 189 is supplied to evaporator 187 from reservoir 190. Successive layers can be applied to web 182 using multiple passes through apparatus 180. Apparatus 180 can be enclosed in a suitable chamber (not shown in FIG. 6) and maintained under vacuum or supplied with a suitable inert atmosphere in order to discourage oxygen, water vapor, dust and other atmospheric contaminants from interfering with the various pretreatment, monomer coating, crosslinking and sputtering steps.

The metal layer or layers of the EMI shielding film are connected to at least one grounding electrode such as electrode 124. The grounding electrode(s) can be connected to the metal layer(s) before or after the EMI shielding film is joined to other materials or to a device requiring EMI shielding. Grounding electrodes can be formed using masking, plating and other printed circuitry techniques that will be familiar to those skilled in the art, or formed using metallic strips, wires, conductive paints and other connections that will likewise be familiar to those skilled in the art. 3M™ Conductive Tapes 9703 and 9713 (3M, St. Paul Minn.) are particularly preferred grounding electrodes. These tapes contain fibers or particles that penetrate the outermost crosslinked polymer layer and provide an electrical connection to the underlying metal layer. Appropriate busbars can be employed with such tapes when two or more metal layers are to be connected in series or in parallel.

In another embodiment, the metal layer need not be grounded. Although less preferred, such an embodiment does provide EMI shielding via reflection, and can be used for applications where lower levels of EMI shielding can be tolerated. Applications for such ungrounded EMI shielding films include testing facilities, security/secure rooms, antennae components.

In a shielded article of the invention, preferably the majority and most preferably the entire EMI shielding film perimeter is connected to the grounding electrode(s). The grounding electrode(s) normally are connected or bonded to the device requiring EMI shielding or to a housing (e.g., a nontransparent housing) surrounding the device.

When the EMI shielding film contains multiple metal layers, one or more of the layers can be used for EMI shielding and one or more of the remaining layers can be used for a purpose other than EMI shielding. e.g., for heating, intrusion detection, touch detection or other purposes. Heating films containing multiple metal layers are described in copending application Ser. No. 10/222,449, filed Aug. 17, 2002 and entitled "FLEXIBLE ELECTRICALLY CONDUCTIVE FILM", incorporated herein by reference.

The EMI shielding films can be joined or laminated to a wide variety of substrates. Typical substrate materials include glazing materials such as glass (which may be insulated, tempered, laminated, annealed, or heat strengthened) and plastics (such as polycarbonates and polymethylmethacrylate). The invention is especially useful in connection with non-planar substrates, especially those having a compound curvature. The EMI shielding film preferably is capable of conforming to such nonplanar substrates without substantial cracking or creasing.

Assembly of the EMI shielding films in a completed device or adjacent to an enclosed area can be carried out using techniques that will be familiar to those skilled in the art. For example, representative construction details for EMI shielding windows can be found in *The Design of Shielded Enclosures: Cost-Effective Methods to Prevent EMI*, by Louis T. Gnecco (Newnes Publishing: Butterworth-Heinemann, Boston, 2000). Additional EMI shielding materials such as gaskets, tapes, fabrics, foams or other materials may be employed in combination with the EMI shielding films. Representative EMI shielding equations and techniques for using such other materials are described in the book cited above; in *A Handbook Series on Electromagnetic Interference and Compatibility* (Interference Control Technologies, Inc., Gainesville, Va., 1988), especially Volume 3: *Electromagnetic Shielding*, by Donald R. J. White and Michel Mardiguian; Volume 8: *EMI Control Methodology and Procedures*, by Michel Mardiguian; and in Chapter 8: *Electromagnetic Compatibility for Electrical Engineering*, by B. A. Austin, of *Electrical Engineer's Reference Book*, by G. R. Jones, M. A. Laughton, and M. G. Say (Butterworth-Heinemann, Oxford, UK, 1993). Representative devices include instruments, displays (e.g., plasma displays), imaging equipment (e.g., magnetic resonance imaging equipment), computer equipment (e.g., servers), communications equipment (e.g., cellular phones), medical devices and the like. Representative enclosed areas include rooms (e.g., secure meeting rooms and test equipment facilities), transmission facilities (or portions thereof), cabinets, tents and the like. The film can be self-supporting or carried on a substrate. If desired, the film can be formed over or adhered to a non-planar substrate (e.g., a compound curve substrate). The film can also be placed in an injection mold and thereby incorporated onto the surface of a molded part. Those skilled in the art will appreciate that a variety of other fabrication techniques can be used with the EMI shielding films of this invention.

The invention provides optically transparent, flexible, extensible EMI shielding films that can block the transmission of unwanted electromagnetic energy out of or into electronic equipment and other devices that can cause or are sensitive to electromagnetic interference. These EMI shielding films can provide dramatically better mechanical durability and corrosion resistance than typical commercially available optically transparent EMI shielding films, while providing comparable optical transparency and shielding power. Surprisingly, the films of the present invention retain their EMI shielding capability even when stretched, bent, or creased. The EMI shielding films used in the invention preferably retain their EMI shielding capability when strained in a tensile mode by 10% or more of their original length. Preferably, they retain their EMI shielding capability when strained in a tensile mode by 50% or more of their original length. This is an unexpected result, since commercially available EMI shielding films lose their EMI shielding capability at strains well below 10%, e.g., at 2% strain. The EMI shielding films used in the invention preferably retain their EMI shielding capability when bent at a 45° angle, and more preferably when bent at a 90° angle. Most preferably, they retain their EMI shielding capability when bent or creased at a 180° angle. This is an unexpected result, since commercially available EMI shielding films lose their EMI shielding capability when bent or even when roughly handled.

The following tests were used to evaluate various EMI shielding films:

Corrosion Test

Two strips 25.4 mm wide by about 254 to 305 mm long were cut from the center of a film sample. The strips were placed in jars containing 20% KCl solution at room temperature so that about 150 to 200 mm of each strip was immersed into the salt solution. The jar tops were screwed onto the jars to prevent the salt solution from evaporating. The strips were removed after 15 minutes of immersion, placed support side down on a dry paper towel and wiped with tissue or a paper towel along the width of the strip. Medium pressure was applied while wiping. The strips were next washed with cold water to remove salt from the surface and the film surface appearance was observed. The appearance rating was based on a visual estimate of the amount of the metal layer removed after wiping the strip, expressed as a percentage of the original metal layer area.

Corrosion Under Electrical Current Test

Two strips 25.4 mm wide by 203 mm long were cut from the center of a film sample. The narrow ends of the strips were painted on both sides with No. 22–201 silver paint (Katy Company). After the silver paint dried, copper was folded over the painted edges to form a durable electrode at each end of the strip. Alligator clips were used to connect a power supply to the copper electrodes. A voltage of 4.0 volts was applied between the contacts and the resulting current was measured and recorded. A 125 to 150 mm long section near the center of each strip was then submerged into 20% KCl solution at room temperature. The electrical current was measured and recorded during the course of the immersion time.

Adhesion Test

Squares about 254 mm wide by about 254 mm long were cut from the center of a film sample. 25.4 mm wide by 178 mm long pieces of masking tape and filament tape were each applied to the film in both the MD and TD directions, pressed with a 2.3 kg roller, then aged for one week. The adhesion test rating was based on a visual estimate of the amount of the metal layer remaining after peeling away the tapes, expressed as a percentage of the original metal layer area.

Conductivity vs. Strain Test

As an approximate measure of the level of strain at which an EMI shielding film would lose its EMI shielding capability, EMI shielding film samples were stretched using a SINTECH™ 200/S TENSILE TESTER (Instron Corp.) to determine the percent strain at which the film would stop conducting electricity. A strip prepared as in the Corrosion Under Electrical Current test was clamped into the jaws of the tensile tester, and alligator clips were used to connect a power supply to the copper electrodes. While using a gauge length of 101.6 mm and a crosshead speed of 25.4 mm/min, a constant voltage of 4 volts was supplied to the strip and the current flow was measured and recorded vs. % strain.

Sheet Resistance Test

Films of the invention were evaluated for sheet resistance, or surface resistivity, using a non-contact conductivity measuring device (Model 717B Benchtop Conductance Monitor, Delcom Instruments Inc.).

Solar Heat Gain Coefficient and Shading Coefficient

The value Te is defined as the ratio, expressed in percent, of the solar energy transmitted by a specimen from 250 nm to 2500 nm divided by the total incident solar energy. The value Ae is defined as the ratio, expressed in percent, of the solar energy absorbed by a specimen from 250 nm to 2500 nm divided by the total incident solar energy. Solar properties are calculated using solar irradiance data from ASTM E891 using air mass 1.5. The Solar Heat Gain Coefficient (SHGC) is calculated as $SHGC=Te+0.27(Ae)$.

The Shading Coefficient (SC) is defined as the ratio of the Solar Heat Gain Coefficient through a given glazing to that through a single pane of standard 3.2 mm thick window glass, and is calculated as $SC=SHGC/87.0$.

EMI Shielding Strength

EMI Shielding Strength was evaluated according to ASTM D-4935-99, via a far field type test using a coaxial TEM cell. The results are reported in decibels (dB).

The invention will now be described with reference to the following non-limiting examples, in which all parts and percentages are by weight unless otherwise indicated.

EXAMPLE 1

(Layer 1) An approximately 300 meter long roll of 0.05 mm thick by 508 mm wide PET support (MELINEX™ No. 453 film, DuPont Teijin Films) was loaded into a roll to roll vacuum chamber like that shown in FIG. 6. The pressure in the vacuum chamber was reduced to $3\times10^{-4}$ torr. The support was sequentially plasma pretreated and acrylate coated during one pass at a web speed of 36.6 m/min. The plasma pretreatment utilized a chrome target and an unbalanced dc magnetron operated at 1500 watts power (429 volts and 3.5 amps) under a nitrogen atmosphere with a nitrogen gas flow of 70 sccm. The acrylate coating employed a 50:50 mixture of IRR214 acrylate (UCB Chemicals) and lauryl acrylate that had been degassed for 1 hour by placing a container of the liquid monomer mixture into a bell jar and reducing pressure to approximately 1 millitorr. The degassed monomer was pumped at a flow rate of 2.35 ml/min through an ultrasonic atomizer into a vaporization chamber maintained at 274° C. Using a drum temperature of −18° C., the monomer vapor was condensed onto the moving web and electron beam crosslinked using a single filament gun operated at 7.59 kV and 2.0 milliamps.

(Layer 2) The web direction was reversed. Again operating at 36.6 m/min, the acrylate surface was plasma treated and coated with magnetron sputtered silver. The plasma pretreatment was as before but at 413 volts and 3.64 amps. The silver was sputtered at 10,000 watts power (590 volts and 16.96 amps), a drum temperature of 25° C. and an argon atmosphere with an argon gas flow of 90 sccm.

(Layer 3) The web direction was again reversed. Again operating at 36.6 m/min, a crosslinked spacing layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 7.8 kV and 3.8 milliamps.

(Layer 4) The web direction was again reversed. Again operating at 36.6 m/min, the crosslinked spacing layer was plasma pretreated and coated with magnetron sputtered silver. The plasma pretreatment was as before but using 429 volts and 3.5 amps. The silver was sputtered as before but at 590 volts, 16.94 amps, and a drum temperature of 22° C.

(Layer 5) The web direction was again reversed. A protective layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 10.11 kV and 3.8 milliamps.

Figure 7:
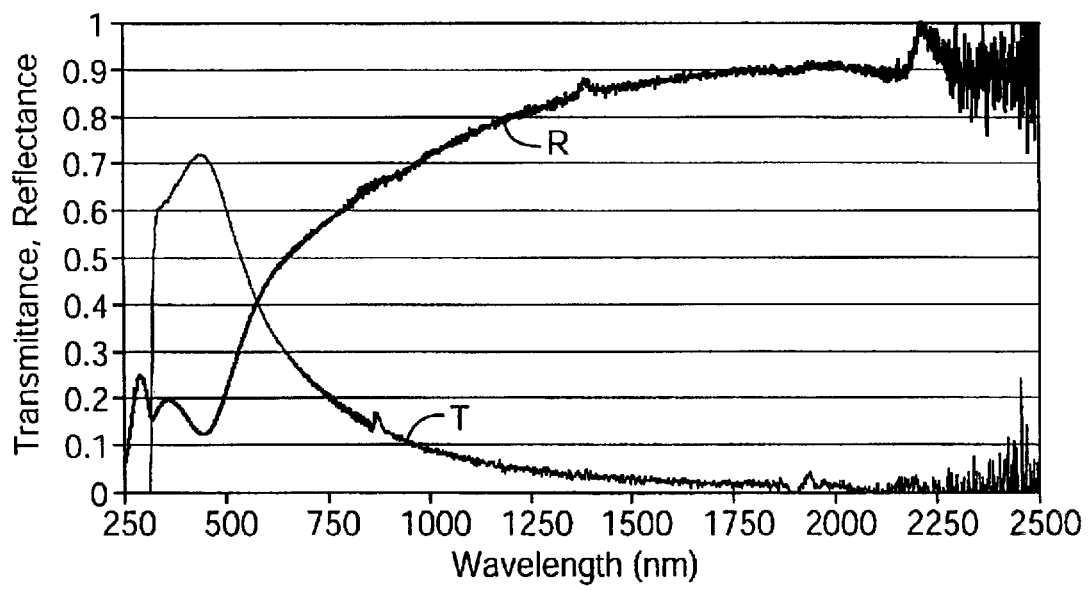
FIG. 7 and FIG. 8 are graphs showing transmittance and reflectance for two films for use in the invention.

The optical properties of the resulting 5 layer infrared-rejecting acrylate/Ag/acrylate/Ag/acrylate optical stack are shown in FIG. 7. Curves T and R respectively show the transmission ($T_{vis}$) and reflection for the finished film. Using optical modeling and assuming a Bruggerman density for silver of 0.97, the five layers had calculated thicknesses of 120 nm (acrylate layer 1)/12 nm (Ag layer 2)/85 nm (acrylate layer 3)/12 nm (Ag layer 4)/120 nm (acrylate layer 5).

EXAMPLE 2

Using the method of Example 1, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was as before but at 1000 watts power (402 volts and 2.5 amps) and a nitrogen gas flow of 102 sccm. The monomer flow rate was 2.45 ml/min and the vaporization chamber temperature was 276° C. The monomer vapor was condensed onto the moving web using a −21° C. drum temperature. The electron beam filament was operated at 8.0 kV and 6.5 milliamps.

(Layer 2) The plasma pretreatment was at 1000 watts power (309 volts and 3.34 amps) and a nitrogen gas flow of 90 sccm. The silver was sputtered at 570 volts and 17.88 amps, a drum temperature of 21° C. and an argon gas flow of 93.2 sccm.

(Layer 3) The silver surface was plasma pretreated prior to deposition of the spacing layer. The plasma pretreatment utilized a chrome target and 1000 watts power (308 volts and 3.33 amps). Using a drum temperature of −23° C., the monomer vapor was condensed onto the moving web and electron beam crosslinked using a single filament gun operated at 8.0 kV and 6.0 milliamps.

(Layer 4) The plasma pretreatment was at 316 volts and 3.22 amps, and the nitrogen gas flow rate was 90 sccm. The silver was sputtered at 567 volts and 17.66 amps, a drum temperature of 20° C., and an argon gas flow of 95.5 sccm.

(Layer 5) The silver surface was plasma pretreated prior to deposition of the protective layer. The plasma pretreatment was the same as in Layer 3. Using a drum temperature of −23° C., the monomer vapor was condensed onto the moving web and electron beam crosslinked using a single filament gun operated at 8.0 kV and 6.2 milliamps.

Figure 8:
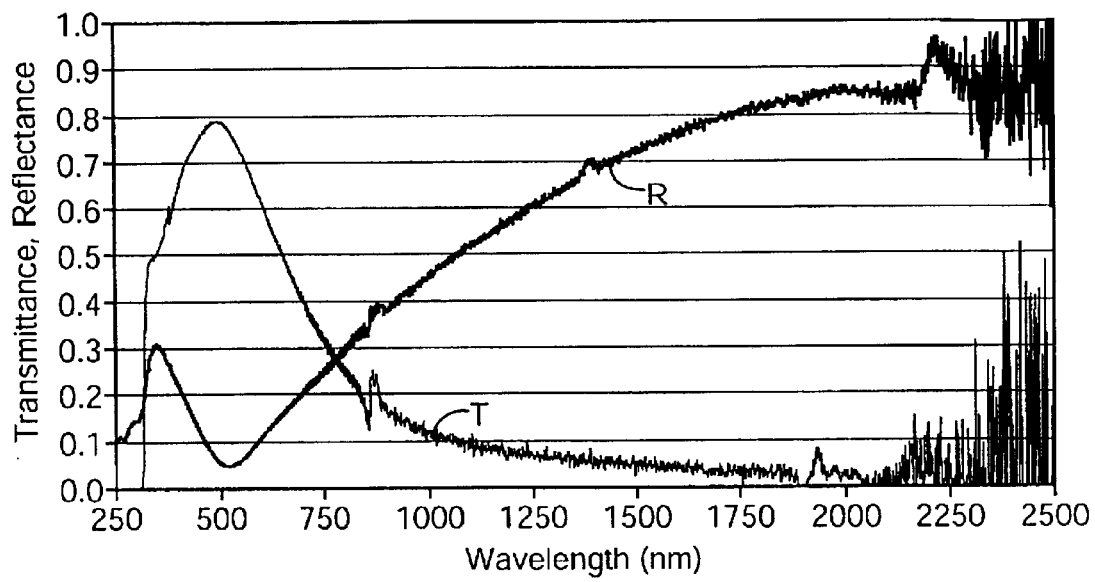

The optical properties of the resulting 5 layer infrared-rejecting acrylate/Ag/acrylate/Ag/acrylate optical stack are shown in FIG. 8. Curves T and R respectively show the transmission and reflection for the finished film. Using optical modeling and assuming a Bruggerman density for silver of 0.97, the five layers had calculated thicknesses of 120 nm (acrylate layer 1)/9 nm (Ag layer 2)/95 nm (acrylate layer 3)/9 nm (Ag layer 4)/120 nm (acrylate layer 5).

EXAMPLES 3–5

Using the method of Example 2, 5 layer infrared-rejecting acrylate/Ag/acrylate/Ag/acrylate optical stacks with silver layers of varying thickness were formed on a PET support. The resulting films were evaluated for appearance, transmission ($T_{vis}$), reflection, solar heat gain coefficient (SHGC), shading coefficient (SC) and sheet resistivity. The processing conditions and evaluation results are set out below in Table 1.

TABLE 1

|  | Ex. 3 | Ex. 4 | Ex. 5 |
|---|---|---|---|
| Layer 1 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −21 | −21 | −21 |
| Monomer feed (ml/min) | 2.65 | 2.65 | 2.65 |
| Layer 2 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 26 | 26 | 26 |
| Sputter power (KW) | 10 | 10 | 10 |
| Layer 3 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −19 | −19 | −19 |
| Monomer feed (ml/min) | 2.65 | 2.65 | 2.65 |
| Layer 4 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 28 | 28 | 28 |
| Sputter power (KW) | 10 | 10 | 10 |

TABLE 1-continued

|  | Ex. 3 | Ex. 4 | Ex. 5 |
|---|---|---|---|
| Layer 5 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −18 | −18 | −18 |
| Monomer feed (ml/min) | 1.35 | 1.35 | 1.35 |
| Results: |  |  |  |
| Appearance | Good | Good | Good |
| Trans-Luminous Y ($T_{vis}$) | 72.37 | 72.14 | 71.53 |
| Refl-Luminous Y | 12.36 | 10.92 | 11.18 |
| SHGC | 46.28 | 46.84 | 48.04 |
| SC | 0.5320 | 0.5384 | 0.5522 |
| Sheet Resistivity (Ohms/Square) | 3.929 | 4.505 | 4.673 |

Figure 9:
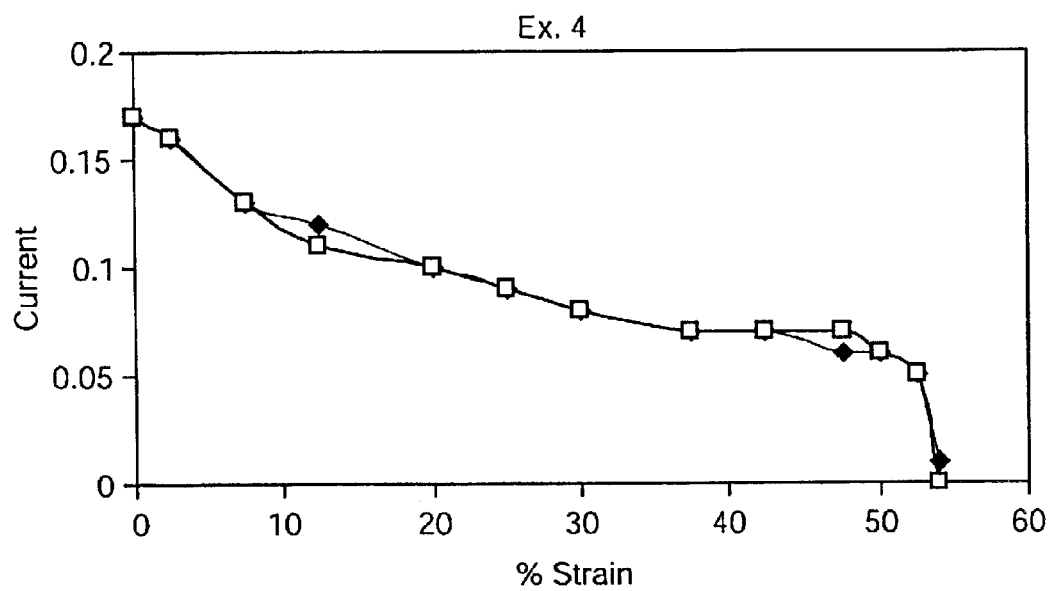
FIG. 9 through FIG. 11 are graphs showing conductance vs. strain for three films for use in the invention.
Figure 10:
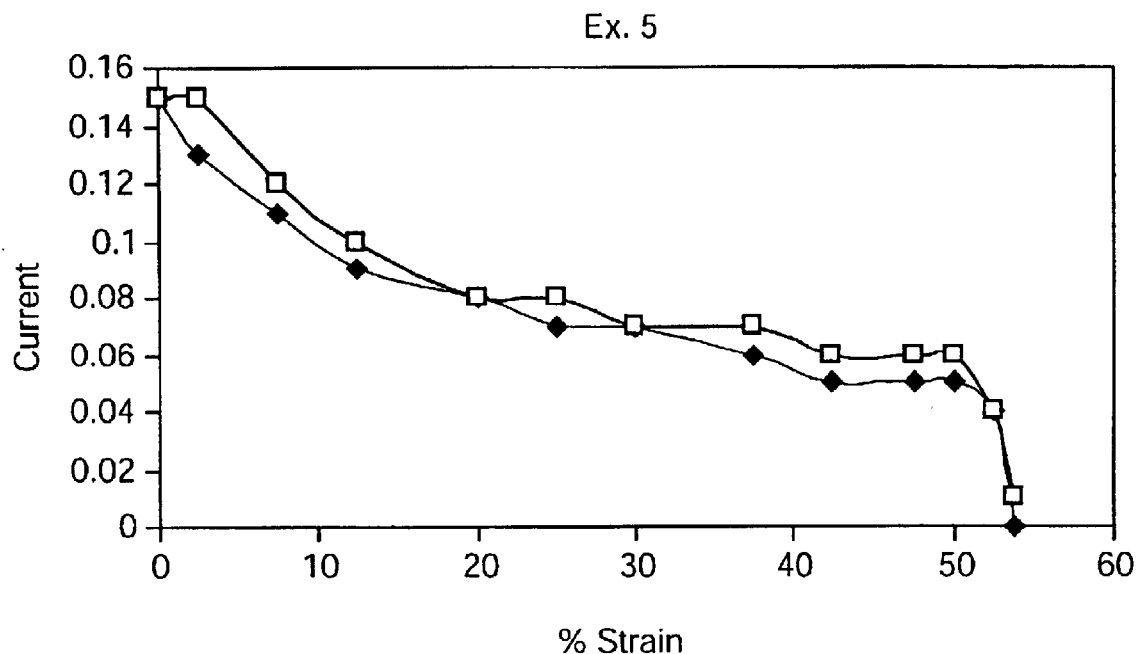

The results in Table 1 show the use of varying line speeds to alter the thickness of the metal layers. Films having a $T_{vis}$ as high as 72% and sheet resistance as low as 3.9 Ohms/square were obtained. Two samples each of the films of EXAMPLES 4 and 5 were also evaluated using the conductivity vs. strain test. The results are shown in FIG. 9 and FIG. 10, respectively. All film samples conducted current at up to 50% or more strain.

Comparative Example 1

A commercial product based on transparent silver layers and an indium oxide inorganic dielectric (XIR™ 75 film, Southwall Technologies Inc.) was evaluated using the conductivity vs. strain test. The sample failed when subjected to only 1% strain.

EXAMPLES 6–11

Using the method of EXAMPLES 3 through 5, 5 layer infrared-rejecting acrylate/Ag/acrylate/Ag/acrylate optical stacks were formed on a PET support (Examples 6–9) or a birefringent multilayer optical film support (3M™ Solar Reflecting Film No. 41-4400-0146-3, EXAMPLES 10–11) and optionally given a plasma post-treatment. The thickness of layer 5 was varied by altering the deposition conditions as shown below. The resulting films were evaluated for appearance, transmission, reflection, solar heat gain coefficient, shading coefficient and sheet resistivity. The processing conditions and evaluation results are set out below in Table 2.

TABLE 2

|  | Ex. 6 | Ex. 7 | Ex. 8 | Ex. 9 | Ex. 10 | Ex. 11 |
|---|---|---|---|---|---|---|
| Support | PET | PET | PET | PET | MOF | MOF |
| Layer 1 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −21 | −21 | −21 | −21 | −21 | −21 |
| Monomer feed (ml/min) | 2.65 | 2.65 | 2.65 | 2.65 | 2.65 | 2.65 |
| Layer 2 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 26 | 26 | 26 | 26 | 19 | 19 |
| Sputter power (KW) | 10 | 10 | 10 | 10 | 10 | 10 |
| Layer 3 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −19 | −19 | −19 | −19 | −20 | −20 |
| Monomer feed (ml/min) | 2.65 | 2.65 | 2.65 | 2.65 | 2.85 | 2.85 |
| Layer 4 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 28 | 28 | 28 | 28 | 23 | 23 |
| Sputter power (KW) | 10 | 10 | 10 | 10 | 10 | 10 |
| Layer 5 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −18 | −18 | −18 | −18 | −17 | −17 |
| Monomer feed (ml/min) | 1.45 | 1.25 | 1.35 | 1.35 | 1.35 | 1.35 |
| Plasma Post-Treatment | | | | | | |
| Line speed (m/min) | | | 36.6 | 36.6 | | 36.6 |
| Plasma (Watts) | | | 1500 | 1000 | | 1000 |
| Results: | | | | | | |
| Appearance | Good | Good | Good | Good | Good | Good |
| Trans-Luminous Y ($T_{vis}$) | 71.51 | 70.09 | 68.19 | 72.59 | 72.69 | 72.51 |
| Refl-Luminous Y | 11.73 | 12.02 | 11.86 | 7.75 | 11.16 | 10.15 |
| SHGC | 46.60 | 46.25 | 44.82 | 46.81 | 44.97 | 45.63 |
| SC | 0.5356 | 0.5316 | 0.5152 | 0.5381 | 0.5169 | 0.5244 |
| Sheet Resistivity (Ohms/Square) | 4.23 | 4.38 | 5.709 | 5.208 | 3.927 | 4.389 |

Figure 11:
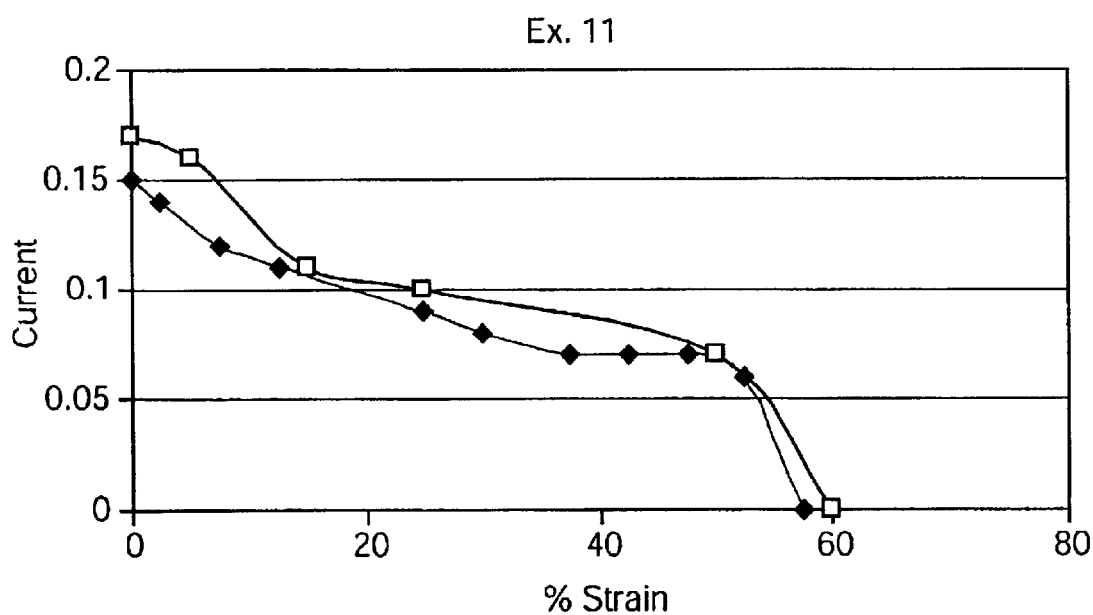

The results in Table 2 show the use of two different substrates, varying protective topcoat thickness and an optional plasma post-treatment of the topcoat. Films having a $T_{vis}$ as high as about 73% and sheet resistance as low as 3.9 Ohms/square were obtained. Two samples of the film of Example 11 were also evaluated using the conductivity vs. strain test. The results are shown in FIG. 11. Both film samples conducted current at up to 50% or more strain.

EXAMPLE 12

Using the method of Example 2, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was at 1000 watts power but using 322 volts, 3.15 amps and a nitrogen gas flow of 70 sccm. The monomer flow rate was 2.65 ml/min and the vaporization chamber temperature was 274° C. The monomer vapor was condensed onto the moving web using a −20° C. drum temperature. The electron beam filament was operated at 8.04 kV and 5.7 milliamps.

(Layer 2)

The plasma pretreatment was at 1000 watts power but using 378 volts, 3.09 amps and a nitrogen gas flow of 70 sccm. The silver was sputtered at 547 volts, 18.36 amps, a drum temperature of 26° C. and an argon gas flow of 70 sccm.

(Layer 3) The plasma pretreatment was at 1000 watts power but using 327 volts and 3.1 amps. The monomer vapor was condensed onto the moving web using a drum temperature of −19° C. The electron beam filament was operated at 8.04 kV and 6.3 milliamps.

(Layer 4) The plasma pretreatment was at 1000 watts power but using 328 volts, 3.07 amps and a nitrogen gas flow rate of 70 sccm. The silver was sputtered at 546 volts, 18.34 amps, a drum temperature of 28° C., and an argon gas flow of 70 sccm.

(Layer 5) The plasma pretreatment was at 1000 watts power but using 359 volts and 2.82 amps. The monomer vapor was condensed onto the moving web using a drum temperature of −18° C. The electron beam filament was operated at 8.04 kV and 4.6 milliamps.

Figure 12:
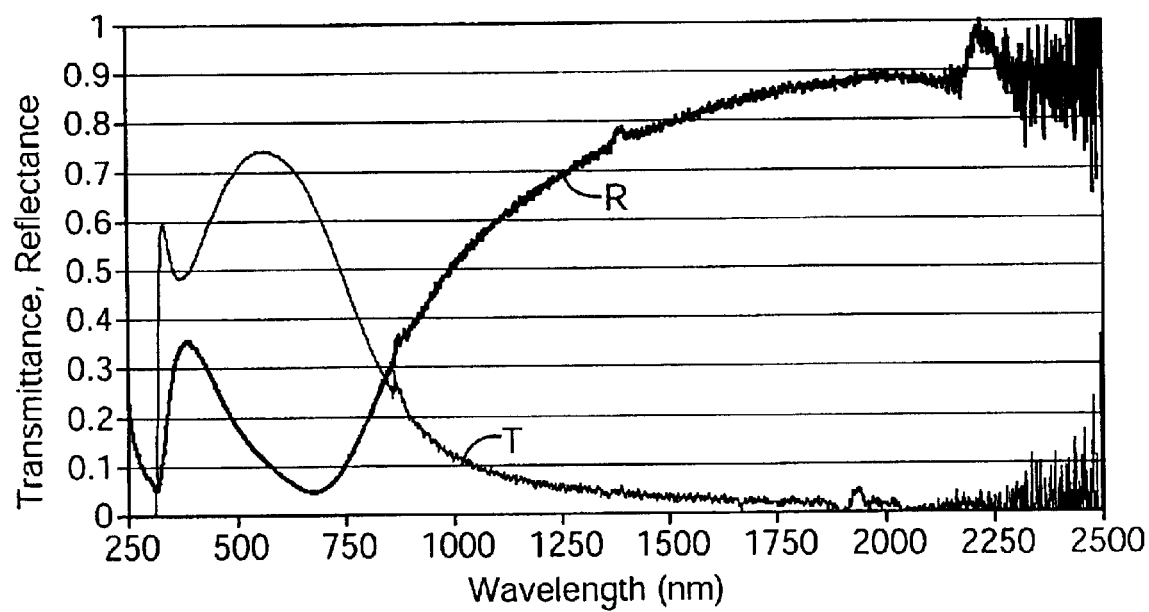
FIG. 12 is a graph showing transmittance and reflectance for a film for use in the invention.

The optical properties of the resulting 5 layer infrared-rejecting acrylate/Ag/acrlate/Ag/acrylate optical stack are shown in FIG. 12. Curves T and R respectively show the transmission and reflection for the finished film. The film had a $T_{vis}$ of 71.5%. The film was next cut into a 30.5 cm by 2.54 cm strip. The edges were painted with a silver conductive paint (SILVER PRINT™, O. K. Thorsen Inc.). A 2.54 cm by 2.54 cm copper foil was folded over each of the opposing narrow ends of the strip and connected using test leads equipped with alligator clips to a 0-20 volt power supply (Model 6253A dual DC, Hewlett Packard, Inc.). A voltage was applied to the strip and the current and strip temperature were measured as a function of time. When the strip temperature stopped increasing, a higher voltage was applied. The results are shown below in Table 3.

TABLE 3

| Time (min) | Volts | Amps | Power (W) | Power (W/cm$^2$) | Temp (° C.) |
| --- | --- | --- | --- | --- | --- |
| 0 | 0 | 0 | — | — | 23.4 |
| 1 | 16 | 0.265 | 4.24 | 0.0548 | 51.3 |
| 2 | 16 | 0.265 | 4.24 | 0.0548 | 54 |
| 3 | 16 | 0.265 | 4.24 | 0.0548 | 55.4 |
| 4 | 16 | 0.265 | 4.24 | 0.0548 | 56.4 |
| 6 | 16 | 0.265 | 4.24 | 0.0548 | 57.8 |
| 10 | 16 | 0.265 | 4.24 | 0.0548 | 58.8 |
| 11 | 20 | 0.34 | 6.8 | 0.0878 | 69.9 |
| 12 | 20 | 0.34 | 6.8 | 0.0878 | 73.1 |
| 15 | 20 | 0.34 | 6.8 | 0.0878 | 75.6 |
| 17 | 20 | 0.34 | 6.8 | 0.0878 | 76.4 |
| 19 | 20 | 0.34 | 6.8 | 0.0878 | 76.3 |
| 21 | 24 | 0.42 | 10.08 | 0.1302 | 103.1 |
| 22 | 24 | 0.42 | 10.08 | 0.1302 | 99.8 |
| 23 | 24 | 0.42 | 10.08 | 0.1302 | 103.5 |
| 25 | 24 | 0.42 | 10.08 | 0.1302 | 105.4 |
| 29 | 24 | 0.42 | 10.08 | 0.1302 | 106.9 |
| 33 | 24 | 0.42 | 10.08 | 0.1302 | 107.4 |
| 34 | 24 | 0.42 | 10.08 | 0.1302 | 107.4 |

The results in Table 3 show that the film could withstand very high power densities and very high temperatures without circuit failure. The strip was allowed to cool and then 16 volts were applied to the strip, resulting in a measured current of 0.27 amps. The film became warm to the touch. The film was next bent over the edge of a counter top at a 45° angle, and then at a 90° angle. The film still felt warm to the touch and the current remained at 0.27 amps. The film was next bent at a 180° angle. The sample still felt warm to the touch and the current remained at 0.27 amps. Had cracking occurred, hot spots would have arisen in the film and a substantial current change (or a complete cessation of current flow) would have been observed, accompanied by a loss in EMI shielding capability.

Comparative Example 2

Using the method of Example 20, a sample of XIR™ 75 film (an indium oxide file from Southwall Technologies Inc.) was powered and heated. The sample failed when subjected to 24 volts or when bent. The results are set out below in Table 4.

TABLE 4

| Time (min) | Volts | Amps | Power (W) | Power (W/cm$^2$) | Temp (° C.) |
| --- | --- | --- | --- | --- | --- |
| 0 | 8 | 0.122 | 0.976 | 0.0130 | 23.1 |
| 2 | 8 | 0.122 | 0.976 | 0.0130 | 32.3 |
| 4 | 8 | 0.122 | 0.976 | 0.0130 | 33 |
| 6 | 8 | 0.122 | 0.976 | 0.0130 | 33.4 |
| 7 | 8 | 0.122 | 0.976 | 0.0130 | 33.6 |
| 8 | 8 | 0.122 | 0.976 | 0.0130 | 33.4 |
| 10 | 12 | 0.182 | 2.184 | 0.0291 | 41.7 |
| 11 | 12 | 0.182 | 2.184 | 0.0291 | 42.5 |
| 12 | 12 | 0.182 | 2.184 | 0.0291 | 43 |
| 13 | 12 | 0.182 | 2.184 | 0.0291 | 43.1 |
| 14 | 12 | 0.182 | 2.184 | 0.0291 | 43.5 |
| 15 | 12 | 0.182 | 2.184 | 0.0291 | 43.6 |
| 16 | 12 | 0.182 | 2.184 | 0.0291 | 43.6 |
| 17 | 12 | 0.182 | 2.184 | 0.0291 | 43.7 |
| 18 | 12 | 0.182 | 2.184 | 0.0291 | 43.7 |
| 20 | 16 | 0.24 | 3.84 | 0.0512 | 53.3 |
| 22.5 | 16 | 0.24 | 3.84 | 0.0512 | 55.1 |
| 25 | 16 | 0.24 | 3.84 | 0.0512 | 55.7 |
| 26 | 16 | 0.24 | 3.84 | 0.0512 | 55.7 |
| 27 | 16 | 0.24 | 3.84 | 0.0512 | 55.5 |
| 28 | 16 | 0.24 | 3.84 | 0.0512 | 55.7 |
| 30 | 20 | 0.29 | 5.8 | 0.0773 | 67.3 |
| 32 | 20 | 0.29 | 5.8 | 0.0773 | 71.2 |
| 34 | 20 | 0.29 | 5.8 | 0.0773 | 72 |
| 37.5 | 20 | 0.29 | 5.8 | 0.0773 | 72.3 |
| 38 | 20 | 0.29 | 5.8 | 0.0773 | 72.8 |
| 39 | 20 | 0.29 | 5.8 | 0.0773 | 72.7 |
| 40 | 20 | 0.29 | 5.8 | 0.0773 | 72.7 |
| 41 | 24 | 0 | (Failed) | (Failed) | — |

The results in Table 4 show that the comparison film could be electrically heated. However, when the voltage was increased to 24 volts the film failed. This was believed to be due to cracking of the indium oxide layer. A separate sample of the comparison film was electrically heated using an applied voltage of 16 volts, resulting in a measured current of 0.235 amps. The comparison film became warm to the touch. When the comparison film was bent over the edge of a counter top at a 45° angle, the film failed. Using optical microscopy, a crack could be observed in the coating.

EXAMPLE 13

A 304 mm by 304 mm sample of the film of Example 5 having a sheet resistance of 4.2 ohms/square was electrically joined to busbars so that both metal layers could be grounded.

EXAMPLE 14

A PET support was covered with a three layer acrylate/Ag/acrylate stack. The individual layers were formed as follows:

(Layer 1) A 914 meter long roll of 0.05 mm thick×508 mm wide PET film (MELINEX™ No. 453 film, DuPont-Teijin Films) was loaded into a roll to roll vacuum chamber, and the chamber pressure was pumped to a pressure of 8×10-6 torr. The PET film was coated with an acrylate mixture containing 48.5% IRR214 acrylate, 48.5% lauryl acrylate, and 3.0% EBECRYL™ 170 adhesion promoter. The acrylate mixture was vacuum degassed prior to coating, and pumped at a flow rate of 2.35 ml/min. through an ultrasonic atomizer into a vaporization chamber maintained at 275° C. The PET film was passed over a coating drum maintained at 0° C. at a web speed of 30.4 meters/min, where the monomer vapor was condensed, then subsequently electron beam crosslinked with a single filament operated at 8.0 kV and 2.0 milliamps. This produced an acrylate layer having a 100 nm thickness after cure.

(Layer 2) The web direction was reversed inside the chamber, and the acrylate surface was sputter coated with a silver layer. The silver was sputtered at 10,000 watts power, using argon as the sputtering gas at a chamber pressure of 2.0 millitorr, and a web speed of 30.4 meters/minute to provide a 10 nm thick silver layer.

(Layer 3) The web direction was again reversed. Using the same conditions as for Layer 1, a 100 nm thick acrylate layer was deposited onto the silver layer.

The resulting three layer film stack exhibited good spectral transmission and reflectance characteristics, and had an electrical resistivity of 10 ohms/sq. When the Corrosion Under Electrical Current Test was performed the current fell to zero a few seconds after immersion. This indicated that mere-that silver corrosion, electrical circuit failure and likely loss of EMI shielding capability had taken place more rapidly than would be desirable under severe corrosion conditions.

EXAMPLE 15

A second three layer film stack was prepared in the same manner as Example 14, but using a nitrogen plasma pretreatment (of the PET, Layer 1 acrylate coating, and Layer 2 silver coating) prior to the deposition of the subsequent layer. The nitrogen plasma was applied using an unbalanced dc magnetron source, operated at 1.0 kW and 2.0 millitorr pressure. When the Corrosion Under Electrical Current Test was performed the current did not fall to zero until 500 to 600 seconds after immersion, indicating much slower silver corrosion and electrical circuit failure than in Example 14, and improved retention of EMI shielding capability.

EXAMPLE 16

A three layer film stack was prepared in the same manner as Example 14, with the addition of 2% ethylene glycol bis-thioglycolate to the monomer mixture. When the Corrosion Under Electrical Current Test was performed the current fell to zero 500 to 600 seconds after immersion, indicating slower silver corrosion and electrical circuit failure than in Example 14, and comparable performance to Example 15.

EXAMPLE 17

A three layer film stack was prepared in the same manner as Example 14, but using nitrogen plasma pretreatment as in Example 15 and a 2% ethylene glycol bis-thioglycolate addition as in Example 16. When the Corrosion Under Electrical Current Test was performed the current remained constant for over 900 seconds after immersion, at which time the test was terminated. This indicated that silver corrosion and the likelihood of circuit failure and loss of EMI shielding capability had been further reduced in comparison to EXAMPLES 14 to 16.

EXAMPLE 18

The film of Example 12 was tested for optical transmission at 550 nm, Sheet Resistance and EMI Shielding Strength. The measured optical transmission was 75%, the surface resistivity was 4.5 Ohm/sq, and the EMI shielding strength was 29 dB.

Comparative Example 3

Using the method of Example 18, a sample of AgHT4™ optically transparent EMI shielding mm (CP Films) was evaluated. The measured optical transmission was 76%. the surface resistivity was 4.7 Ohm/sq. and the EMI shielding strength was 29 dB. The film was crinkled by hand and retested for EMI Shielding Strength. The EMI shielding strength decreased to 5 dB. A fresh sample of the film was also evaluated for corrosion and strain resistance. Circuit failure occurred in 20 seconds in the Corrosion Under Electrical Current Test, and conductivity fell to zero at 2% strain in the Conductivity vs. Strain Test.

EXAMPLE 19

Using the method of Example 12, a PET support was covered with a five layer acrylate/Ag/acrylate/Ag/acrylate optical stack using plasma pretreatment on both the top and bottom of the metal layers. The monomer mixture contained 2% ethylene glycol bis-thioglycolate. The other individual layer differences were as follows:

(Layer 1) The support plasma pretreatment was at 1000 watts power but using 428 volts and 2.3 amps. The monomer vapor was condensed onto the moving web using a −17° C. drum temperature. The electron beam filament was operated at 8.0 kV and 2.8 milliamps.

(Layer 2) The plasma pretreatment was at 1000 watts power but using 368 volts and 2.72 amps. The silver was sputtered at 632 volts, 15.8 amps, a drum temperature of 31° C. and an argon gas flow of 87 sccm.

(Layer 3) The plasma pretreatment was at 1000 watts power but using 430 volts and 2.3 amps. The monomer vapor was condensed onto the moving web using a drum temperature of −17° C. The electron beam filament was operated at 8.0 kV and 4.8 milliamps.

(Layer 4) The plasma pretreatment was at 1000 watts power but using 368 volts and 2.72 amps. The silver was sputtered at 634 volts, 15.8 amps, a drum temperature of 32° C., and an argon gas flow of 87 sccm.

(Layer 5) The plasma pretreatment was at 1000 watts power but using 448 volts and 2.2 amps. The monomer vapor was condensed onto the moving web using a drum temperature of −19° C. The electron beam filament was operated at 8.0 kV and 5.7 milliamps.

The measured optical transmission of the resulting film was 70%, the surface resistivity was 5.6 Ohm/sq, and the EMI Shielding Strength was 28 dB. The film was crinkled by hand as in COMPARATIVE EXAMPLE 3 and retested for EMI Shielding Strength. The EMI Shielding Strength remained at 28 dB, indicating full retention of EMI shielding ability.

Various modifications and alterations of this invention will be apparent to those skilled in the art without departing from this invention. This invention should not be restricted to that which has been set forth herein only for illustrative purposes.

We claim:

1. A process for transparently shielding a device or an enclosed area that can cause or is sensitive to electromagnetic interference, comprising at least partially surrounding the device or area with a visible light-transmissive film comprising a flexible support, an extensible visible light-transmissive continuous metal or metal alloy layer and a visible light-transmissive crosslinked polymeric protective layer, wherein the metal or metal alloy layer is coextensive with the support and when incorporated into the visible light-transmissive film can be stretched by at least 3% in an in-plane direction without loss of electrical continuity and without forming visible discontinuities in the surface of the metal or metal alloy layer as detected by the naked eye at a distance of about 0.25 meters; and connecting at least one grounding electrode to the metal or metal alloy layer.

2. A process according to claim 1 wherein the metal or metal alloy layer comprises silver and the crosslinked polymeric layer comprises an acrylate polymer.

3. A process according to claim 1 wherein the film comprises a base coat layer between the support and the metal or metal alloy layer.

4. A process according to claim 1 wherein the film comprises two or more metal or metal alloy layers.

5. A process according to claim 1 wherein an interface between the metal or metal alloy layer and an adjacent layer within the film has been subjected to an adhesion-enhancing treatment, or one or more adjacent layers within the film comprises an adhesion-enhancing adjuvant, whereby the corrosion resistance of the film is increased.

6. A process according to claim 1 wherein the grounding electrode comprises a tape containing fibers or particles that penetrate the crosslinked polymeric layer.

7. A process according to claim 1 wherein the film has a perimeter the majority of which is connected to a grounding electrode.

8. A process according to claim 1 wherein the film has a perimeter all of which is connected to a grounding electrode.

9. A process according to claim 1 wherein the film has a length and an electromagnetic shielding capability that is retained when the film is strained in a tensile mode by 10% of its length.

10. A process according to claim 1 wherein the film has a length and an electromagnetic shielding capability that is retained when the film is strained in a tensile mode by 50% of its length.

11. A process according to claim 1 wherein the film has an electromagnetic shielding capability that is retained when the film is bent at a 45° angle.

12. A process according to claim 1 wherein the film has an electromagnetic shielding capability that is retained when the film is bent at a 90° angle.

13. A process according to claim 1 wherein the film has an electromagnetic shielding capability that is retained when the film is bent at a 180° angle.

14. An electromagnetically shielded article comprising a device or enclosed area that can cause or is sensitive to electromagnetic interference, wherein the device or area is at least partially surrounded with a visible light-transmissive film comprising a flexible support, an extensible visible light-transmissive continuous metal or metal alloy layer and a visible light-transmissive crosslinked polymeric protective layer, wherein the metal or metal alloy layer is coextensive with the support and when incorporated into the visible light-transmissive film can be stretched by at least 3% in an in-plane direction without loss of electrical continuity and without forming visible discontinuities in the surface of the metal or metal alloy layer as detected by the naked eye at a distance of about 0.25 meters; and at least one grounding electrode connected to the metal or metal alloy layer.

15. An article according to claim 14 wherein the metal or metal alloy layer comprises silver and the crosslinked polymeric layer comprises an acrylate polymer.

16. An article according to claim 14 wherein the film comprises a base coat layer between the support and the metal or metal alloy layer.

17. An article according to claim 14 wherein the film comprises two or more metal or metal alloy layers.

18. An article according to claim 14 wherein an interface between the metal or metal alloy layer and an adjacent layer within the film has been subjected to an adhesion-enhancing treatment, or one or more adjacent layers within the film comprises an adhesion-enhancing adjuvant, whereby the corrosion resistance of the film is increased.

19. An article according to claim 14 wherein the grounding electrode comprises a tape containing fibers or particles that penetrate the crosslinked polymeric layer.

20. An article according to claim 14 wherein the film has a perimeter the majority of which is connected to a grounding electrode.

21. An article according to claim 14 wherein the film has a perimeter all of which is connected to a grounding electrode.

22. An article according to claim 14 wherein the film has a length and an electromagnetic shielding capability that is retained when the film is strained in a tensile mode by 10% of its length.

23. An article according to claim 14 wherein the film has a length and an electromagnetic shielding capability that is retained when the film is strained in a tensile mode by 50% of its length.

24. An article according to claim 14 wherein the film has an electromagnetic shielding capability that is retained when the film is bent at a 45° angle.

25. An article according to claim 14 wherein the film has an electromagnetic shielding capability that is retained when the film is bent at a 90° angle.

26. An article according to claim 14 wherein the film has an electromagnetic shielding capability that is retained when the film is bent at a 180° angle.

27. An electromagnetically shielded article comprising an electromagnetic shield surrounding a device or enclosed area that can cause or is sensitive to electromagnetic interference, wherein at least a portion of the shield comprises a visible light-transmissive film comprising a flexible support, and first and second extensible visible light-transmissive continuous metal or metal alloy layers separated by a visible light-transmissive crosslinked polymeric protective layer, wherein the metal or metal alloy layer is coextensive with the support and when incorporated into the visible light-transmissive film can be stretched by at least 3% in an in-plane direction without loss of electrical continuity and without forming visible discontinuities in the surface of the metal or metal alloy layer as detected by the naked eye at a distance of about 0.25 meters.

* * * * *

UNITED STATES PATENT AND TRADEMARK OFFICE
CERTIFICATE OF CORRECTION

| | | |
|---|---|---|
| PATENT NO. | : 6,818,291 B2 | Page 1 of 2 |
| APPLICATION NO. | : 10/222465 | |
| DATED | : November 16, 2004 | |
| INVENTOR(S) | : Arnold W. Funkenbusch | |

It is certified that error appears in the above-identified patent and that said Letters Patent is hereby corrected as shown below:

On the title page item (57), Col. 1, Page 2, Line 3: After "et al" insert -- . --, therefore.

Col. 3, Line 8: Delete "the" and insert -- a --, therefore.

Col. 3, Line 23: Delete "6" and insert -- 16 --, therefore.

Col. 3, Line 64: Delete "am" and insert -- nm --, therefore.

Col. 5, Line 11: Delete "Affmito" and insert -- Affinito --, therefore.

Col. 9, Line 12: Delete "shielding." and insert -- shielding, --, therefore.

Col. 9, Line 27: Delete "nonplanar" and insert -- non-planar --, therefore.

Col. 16, Lines 61-65: Delete "The plasma pretreatment was at 1000 watts power but using 378 volts, 3.09 amps and a nitrogen gas flow of 70 sccm. The silver was sputtered at 547 volts, 18.36 amps, a drum temperature of 26°C. and an argon gas flow of 70 sccm." and insert the same on Line 60 after "(Layer 2)", therefore.

Col. 17, Line 15: Delete "acrlate" and insert -- acrylate --, therefore.

Col. 17, Line 67: Delete "file" and insert -- film --, therefore.

Col. 19, Line 19: Delete "mere-that" before "silver".

Col. 19, Line 67: Delete "mm" and insert -- film --, therefore.

Col. 20, Line 1: Delete "76%." and insert -- 76%, --, therefore.

Col. 20, Line 2: Delete "Ohm/sq." and insert -- Ohm/sq, --, therefore.

UNITED STATES PATENT AND TRADEMARK OFFICE
CERTIFICATE OF CORRECTION

PATENT NO. : 6,818,291 B2
APPLICATION NO. : 10/222465
DATED : November 16, 2004
INVENTOR(S) : Arnold W. Funkenbusch It is certified that error appears in the above-identified patent and that said Letters Patent is hereby corrected as shown below:

Col. 20, Line 2: Delete "F.MI" and insert -- EMI --, therefore.

Signed and Sealed this

Tenth Day of April, 2007

JON W. DUDAS
*Director of the United States Patent and Trademark Office*